United States Patent

Igarashi et al.

[11] Patent Number: 5,926,749
[45] Date of Patent: Jul. 20, 1999

[54] AMPLIFIER CIRCUIT HAVING COMMON AGC TO IF AND RF AMPLIFIERS FOR USE IN A TRANSMITTER

[75] Inventors: Sadao Igarashi; Kazuharu Aoki; Satoshi Urabe, all of Fukushima-ken, Japan

[73] Assignee: Alps Electric Co., Ltd., Japan

[21] Appl. No.: 08/818,403

[22] Filed: Mar. 12, 1997

[30] Foreign Application Priority Data

Mar. 29, 1996 [JP] Japan ................................ 8-077097

[51] Int. Cl.⁶ .................................................. H04B 1/06
[52] U.S. Cl. .................. 455/127; 455/234.1; 455/245.1
[58] Field of Search ................................ 455/127, 118, 455/126, 234.1, 234.2, 235.1, 253.2, 245.1, 245.2; 330/133, 129

[56] References Cited

U.S. PATENT DOCUMENTS

| | | | |
|---|---|---|---|
| 4,030,035 | 6/1977 | Ienaka et al. | 455/245.2 |
| 4,555,670 | 11/1985 | Tanaka | 330/252 |
| 4,718,116 | 1/1988 | Jacobs et al. | 455/245 |
| 4,816,772 | 3/1989 | Klotz | 330/254 |
| 5,057,787 | 10/1991 | Arai et al. | 330/254 |
| 5,126,688 | 6/1992 | Nakanishi et al. | 330/285 |
| 5,193,223 | 3/1993 | Walczak et al. | . |
| 5,307,512 | 4/1994 | Mitzlaff | 455/126 |
| 5,638,141 | 6/1997 | Bae et al. | 455/245.2 |

OTHER PUBLICATIONS

Tietze, U.: Schenk, Ch.: Halbleiter–Schaltunagstech–nik, Berlin (and others), Springer, 1983, pp. 476–478.

*Primary Examiner*—Reinhard J. Eisenzopf
*Assistant Examiner*—Marsha D. Banks-Harold
*Attorney, Agent, or Firm*—Brinks Hofer Gilson & Lione

[57] ABSTRACT

An amplifier circuit comprises current-variable mode variable amplifying circuits and for amplifying an IF signal and a current-constant mode variable amplifying circuit for amplifying an RF signal. I and Q signals are applied to the IF-stage variable amplifying circuits and corresponding to two stages through a QPSK modulating circuit and amplified based on an AGC voltage VAGC applied thereto. The IF signal is converted into the RF signal by a mixer, which in turn is applied to the RF-stage variable amplifying circuit where it is amplified based on the AGC voltage VAGC common to the IF stages. The linearly-varied AGC voltage VAGC is converted into an exponentially-varied control current by transistors. Thus, a gain PG [dB] of each of variable amplifying circuits is controlled linearly with the AGC voltage VAGC.

1 Claim, 3 Drawing Sheets

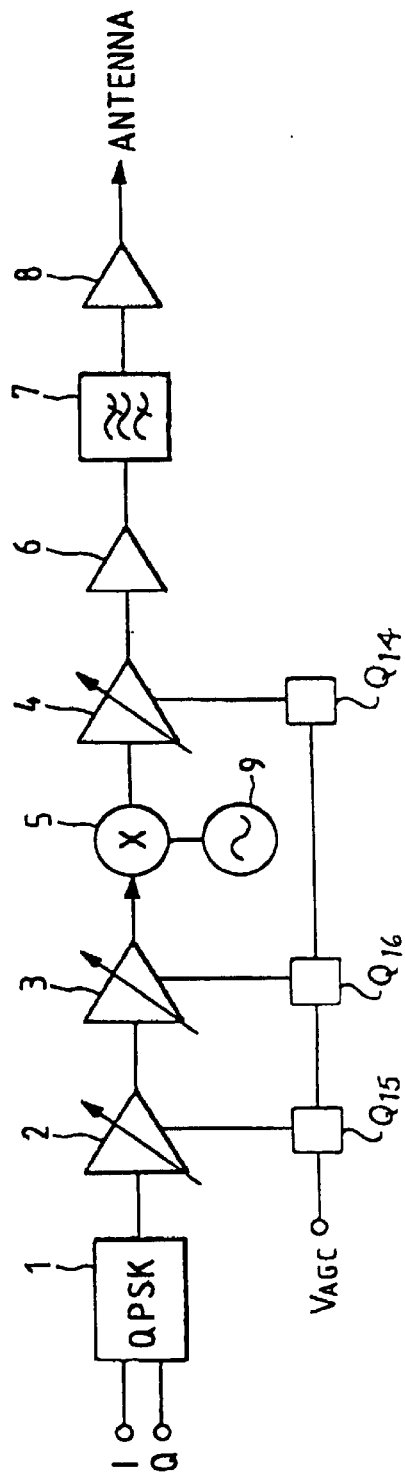
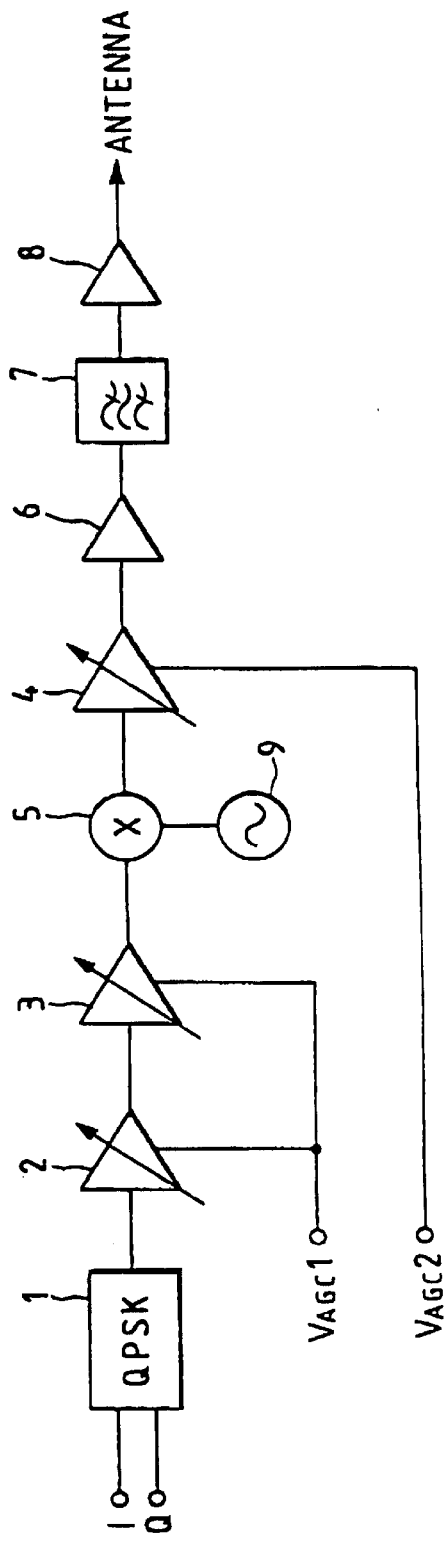

AMPLIFIER CIRCUIT HAVING COMMON AGC TO IF AND RF AMPLIFIERS FOR USE IN A TRANSMITTER

BACKGROUND OF THE INVENTION

1. Field of the Invention

The present invention relates to an amplifier circuit of a transmitter, which is suitable for use in, for example, a CDMA (Code Division Multiple Access) mode portable telephone.

2. Description of the Related Art

In a CDMA mode portable telephone, variable gain amplifying circuits (hereinafter called "variable amplifying circuits") capable of varying a gain of 80 dB or above are normally provided at radio-frequency amplifying circuits of a transmitter unit and a receiver unit, respectively, in order to maintain communications at its movement. FIG. 3 shows a radio frequency stage of a portable telephone having general CDMA and FM dual modes. A description will first be made of a configuration of a transmission (TX) system. An IF (intermediate frequency) transmit signal modulated by a modem 101 is QPSK-modulated by a QPSK modulating circuit 102. Next, the modulated signal is amplified by a transmission-side variable amplifying circuit (TX-AMP) 103, which in turn is mixed into a local oscillating signal produced from a local oscillator (OSC) 121 by a mixer (MIX) 104, where the mixed signal is converted into an RF (radio frequency) transmit signal. The RF transmit signal is transmitted through a band-pass filter 105, a power amplifier (PA) 106, a duplexer 107 and an antenna 108.

A description will next be made of a configuration of a reception (RX) system. An RF receive signal received by the antenna 108 is applied to a mixer (MIX) 111 through the duplexer 107, a low noise amplifier (LNA) 109 and a band-pass filter 110, where the signal is mixed into a local oscillating signal generated from the local oscillator (OSC) 121 so as to be converted into an IF receive signal. The IF receive signal is applied to a CDMA band-pass filter 112 and an FM band-pass filter 113, where one output signal is selected according to a set mode and amplified by a reception-side variable amplifying circuit (RX-AMP) 114. Next, the amplified signal is demodulated by a QPSK demodulating circuit 115, followed by application to the modem 101.

The strength of the received signal, which has been detected by a receive-signal strength indicating circuit (RSSI) 116 provided within the modem 101 is compared with strength reference data by a comparator 117. The difference in strength therebetween is applied to a receive-side AGC voltage correction circuit 118 and a transmitting output correction circuit 119. The AGC voltage correction circuit 118 outputs an AGC voltage so that the difference produced from the comparator 117 becomes "0," i.e., the output of the RSSI 116 coincides with the strength reference data, thereby controlling the gain of the variable amplifying circuit (RX-AMP) 114 on the receiving side.

The difference produced from the comparator 117 and transmitting output correction data determined according to circuit conditions between a portable telephone and a base station are applied to the transmitting output correction circuit 119 on the transmitting side. An AGC voltage correction circuit 120 on the transmitting side outputs an AGC voltage so that a modulated signal is inversely proportional to the level of the received signal, and according to the transmitting output correction data, thereby controlling the gain of the variable amplifying circuit (TX-AMP) 103 on the transmitting side. In this case, excellent linearity is required between the AGC voltage and the gain over a dynamic range of 80 dB or above in order to allow the variable amplifying circuits 103 and 114 on the transmitting and receiving sides to operate in interlock with each other.

In regard to this type of amplifier circuit for the transmitter, a method of constructing both an IF amplifying circuit and an RF amplifying circuit by variable amplifying circuits and controlling the individual variable amplifying circuits with different AGC voltages, thereby realizing a dynamic range of 80 dB or above has heretofore been proposed as disclosed in Japanese Patent Application Laid-Open No. Hei 6-508012 (1994), for example.

FIG. 4 shows such a circuit. I and Q signals used as transmit signals are modulated by a QPSK modulating circuit 1, where it is converted into an IF (intermediate frequency) signal. The IF signal is applied to IF-stage variable amplifying circuits 2 and 3 provided in two stages, where it is amplified based on an AGC voltage VAGC1 used commonly to the IF stages. The IF signal is mixed into a local oscillating signal produced from a local oscillator 9 by a mixer 5, where it is converted to an RF (radio frequency) signal. The RF signal is supplied to an RF-stage variable amplifying circuit 4 where it is amplified based on an AGC voltage VAGC2 used for the RF stage. Further, the RF signal is outputted to an antenna through an amplifier 6, a band-pass filter 7 and a power amplifier 8.

However, the method of controlling the IF-stage variable amplifying circuits 2 and 3 and the RF-stage variable amplifying circuit 4 by the AGC voltages VAGC1 and VAGC2 different from each other in the above-described manner has a problem in that the control circuit becomes complex in configuration. The CDMA mode portable telephone wherein the amplification degree of the transmitter circuit needs to be controlled according to the level (RSSI) of the received signal as shown in FIG. 3, encounters difficulties in obtaining the AGC voltages VAGC1 and VAGC2 different in characteristic from each other from one receiver circuit.

SUMMARY OF THE INVENTION

With the foregoing problems in view, it is an object of the present invention to provide an amplifier circuit suitable for a transmitter, which is capable of realizing a large dynamic range in a simple configuration.

In order to achieve the above object, the present invention resides in that an intermediate frequency variable amplifying circuit is configured in a drive-current variable mode, a radio-frequency variable amplifying circuit is configured in a drive-current constant mode, and an AGC voltage is converted to an exponentially-varied current, whereby the amplification degree of each variable amplifying circuit is controlled based on the common current.

According to the present invention, since the intermediate frequency variable amplifying circuit of drive-current variable mode and the radio-frequency variable amplifying circuit of drive-current constant mode are controlled by the gain linear to the same AGC voltage, a large dynamic range can be realized in a simple structure.

An embodiment of the present invention comprises an intermediate frequency variable amplifying circuit of a drive-current variable mode for amplifying an intermediate frequency signal, a frequency converting circuit for converting the intermediate frequency signal amplified by the intermediate frequency variable amplifying circuit into a radio-frequency variable signal, a drive-current constant mode radio-frequency variable amplifying circuit for amplifying the radio-frequency signal converted by the frequency converting circuit, and an amplification-degree control circuit for converting a linearly-varied AGC voltage to an exponentially-varied current and supplying the current to the intermediate frequency variable amplifying circuit and the radio-frequency variable amplifying circuit, thereby controlling their amplification degrees.

BRIEF DESCRIPTION OF THE DRAWINGS

FIG. 1 is a block diagram showing one embodiment of an amplifier circuit suitable for a transmitter, according to the present invention;

FIG. 4 is a block diagram showing a conventional amplifier circuit suitable for a transmitter.

DESCRIPTION OF THE PREFERRED EMBODIMENT

Figure 2:
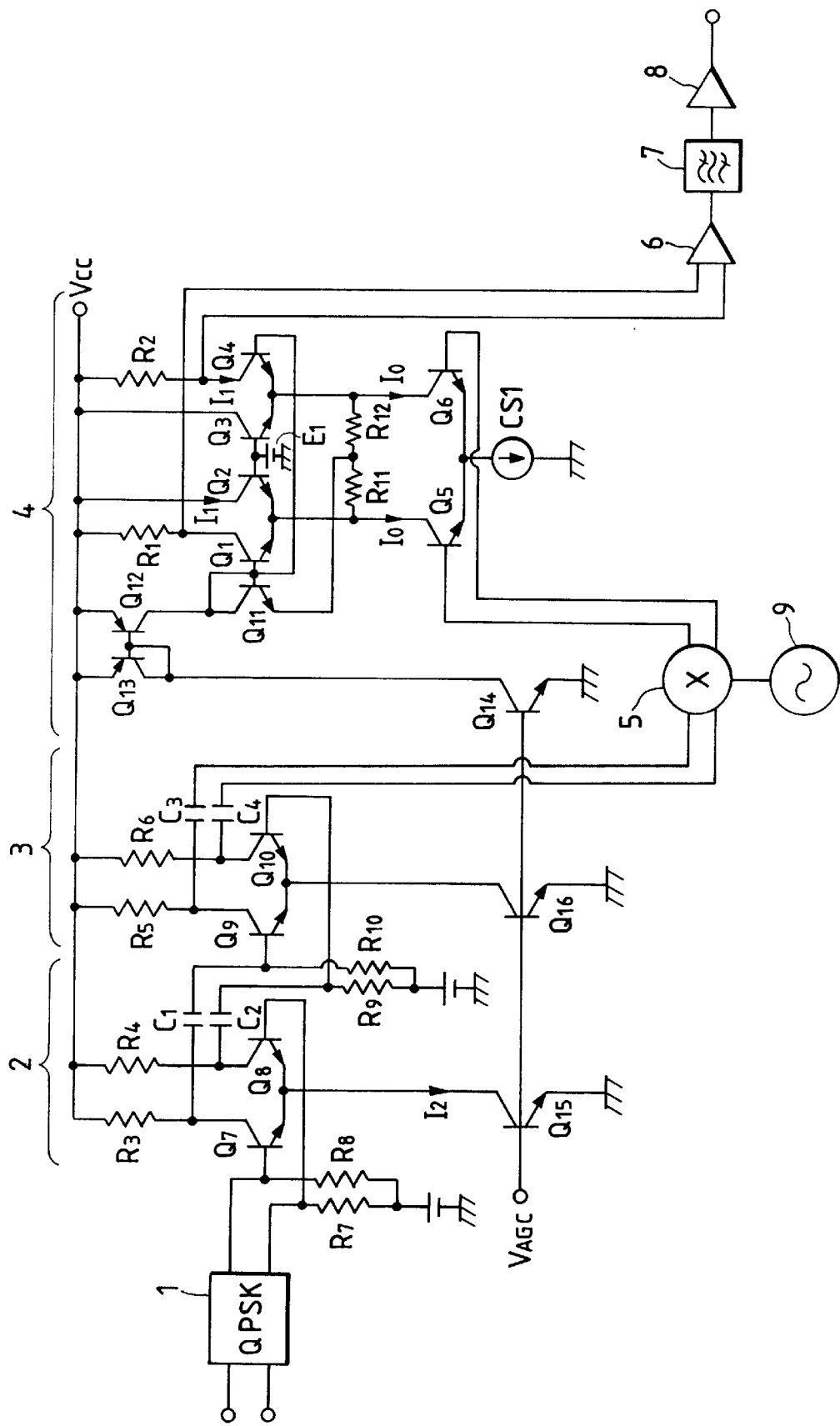
FIG. 2 is a circuit diagram showing the amplifier circuit of FIG. 1 in detail.

A preferred embodiment of the present invention will hereinafter be described with reference to the accompanying drawings. FIG. 1 is a block diagram showing one embodiment of an amplifier circuit for a transmitter, according to the present invention. FIG. 2 is a circuit diagram illustrating the amplifier circuit of FIG. 1 in detail.

Referring to FIG. 1, I and Q signals used as transmit signals are modulated by a QPSK modulating circuit 1, where it is converted into an IF signal. The IF signal is applied to IF-stage variable amplifying circuits 2 and 3 provided in two stages, where it is amplified based on an AGC voltage VAGC used commonly to the IF and RF stages. The IF signal is mixed into a local oscillating frequency produced from a local oscillator 9 by a mixer 5, where it is converted to an RF transmit signal. The RF transmit signal is applied to an RF-stage variable amplifying circuit 4 where it is amplified based on the AGC voltage VAGC used commonly to the IF and RF stages. Further, the RF transmit signal is outputted to an antenna through an amplifier 6, a band-pass filter 7 and a power amplifier 8.

Referring to FIG. 2, a power source voltage Vcc is applied to respective one ends of resistors R3 and R4 of the IF-stage variable amplifying circuit 2, respective one ends of resistors R5 and R6 of the IF-stage variable amplifying circuit 3 of the same configuration, the individual emitters of PNP transistors Q13 and Q12 of the RF-stage variable amplifying circuit 4, respective one ends of resistors R1 and R2, and the individual collectors of NPN transistors Q2 and Q3. Further, the AGC voltage VAGC is applied to the individual bases of NPN transistors Q15, Q16 and Q14 of the variable amplifying circuits 2 through 4.

In the IF-stage variable amplifying circuit 2 corresponding to the first stage, terminals for outputting signals modulated by the QPSK modulating circuit 1 are electrically connected to their corresponding bases of NPN transistors Q7 and Q8 and grounded through resistors R8 and R7 and a bias supply or source. The other ends of the resistors R3 and R4 are electrically connected to their corresponding collectors of the transistors Q7 and Q8 and electrically connected to the IF-stage variable amplifying circuit 3 corresponding to the next stage via coupling capacitors C1 and C2. The emitters of the transistors Q7 and Q8 are electrically connected commonly to the collector (current I2) of the transistor Q15. The emitter of the transistor Q15 is electrically grounded.

Similarly even in the case of the IF-stage variable amplifying circuit 3 corresponding to the next stage, coupling capacitors C3 and C4 are electrically connected to their corresponding bases of NPN transistors Q9 and Q10 and respectively grounded through resistors R10 and R9 and a bias source. The other ends of the resistors R5 and R6 are electrically connected to their corresponding collectors of NPN transistors Q9 and Q10 and are respectively electrically connected to the next-stage mixer 5 through the coupling capacitors C3 and C4. The emitters of the NPN transistors Q9 and Q10 are respectively electrically connected commonly to the collector of the transistor Q16. The emitter of the transistor Q16 is grounded.

In the RF-stage variable amplifying circuit 4, the bases of the transistors Q13 and Q12 are electrically connected commonly to their corresponding collectors of the transistors Q13 and Q14. The emitter of the transistor Q14 is grounded. Further, the collector of the transistor Q12 is electrically connected to the collector and base of an NPN transistor Q11 and the bases of NPN transistors Q1 and Q4. Moreover, the emitter of the NPN transistor Q11 is electrically connected between resistors R11 and R12 connected in series.

The other ends of the resistors R1 and R2 are electrically connected to their corresponding collectors (current I1) of the transistors Q1 and Q4 and the next-stage amplifier 6. The bases of the transistors Q2 and Q3 are commonly grounded through a bias voltage E1. The emitters of the transistors Q1 and Q2 are respectively electrically connected commonly to one end of the resistor R11 and the collector (current I0) of an NPN transistor Q5. Similarly, the emitters of the transistors Q3 and Q4 are respectively electrically connected commonly to one end of the resistor R12 and the collector (current I0) of an NPN transistor Q6. The bases of the transistors Q5 and Q6 are supplied with RF signals produced from the mixer 5, whereas the emitters thereof are commonly grounded through a constant-current source CS1.

The IF-stage variable amplifying circuits 2 and 3 are respectively of an operating-current variable type and their transistors (Q7, Q8) and (Q9, Q10) are respectively of a gain variable type. Their currents I2 are controlled by the transistors Q15 and Q16 respectively. In contrast with the IF-stage variable amplifying circuits 2 and 3, the RF-stage variable amplifying circuit 4 is of an operating-current constant type. However, the linearly-varied AGC voltage VAGC is converted into an exponentially-varied current by the transistor Q14. The gain variable transistors Q1 through Q4 and amplifying transistors Q5 and Q6 constitute a differential amplifier. Further, the transistor Q11 and transistors Q1 and Q4 both constitute current mirror circuits. Similarly, the transistors Q13 and Q12 also constitute a current mirror circuit.

A cell size of the transistor Q11 is set to about 1/50 the size of each of the transistors Q1 and Q4 so that a current flowing in the transistor Q11 does not exert an influence on the amplification of a radio-frequency signal from the transistors Q1 through Q4. Further, the cell size of each of the transistors Q15 and Q16 is set to 100 times the cell size of the transistor Q14 so that currents flowing in the transistors Q7, Q8, Q9, Q10, Q1 and Q4 become equal to each other.

Since the transistors Q1 and Q4 and the transistor Q11 both constitute the current mirror circuits in the RF-stage variable amplifying circuit 4 under such a construction, the currents I0 produced from the transistors Q1 and Q4 flow in proportion to the current flowing through the transistor Q11. Since the currents flowing in the transistors Q11, Q12, Q13 and Q14 are all the same, the currents flowing in the transistors Q1 and Q4 flow in proportion to the current flowing in the transistor Q14. Further, the current flowing in the transistor Q14 exponentially flows with respect to the linearly-varied AGC voltage VAGC.

A gain PG [dB] of the operating-current constant mode RF-stage variable amplifying circuit 4 is given by the following expression:

$$PG \alpha PG0 + 20\log(I1/I0) \tag{1}$$

where PG0 indicates gain at the time that I1 is I0. Further, the relationship between I1 and I0 (I1/I0) is given by the following expression:

$$I1/I0 \alpha [1+exp\{-VAGC * q/(kT)\}] \tag{2}$$

where q: unit charge of electron
k: Boltzmann constant, and
T: absolutely temperature. Thus, since the currents I0 of the transistors Q1 and Q4 are exponentially controlled, the gain PG [dB] of the RF-stage variable amplifying circuit 4 is controlled linearly with the linearly-varied AGC voltage VAGC.

A gain PG [dB] of each of the operating-current variable mode IF-stage variable amplifying circuits 2 and 3 is expressed as follows:

$$PG \alpha 20\log(I2) \tag{3}$$

Further, the current I2 is given by the following expression:

$$I2 \alpha exp\{VAGC * q/(kT)\} \tag{4}$$

Thus, since the collector currents I2 of the transistors Q15 and Q16 vary exponentially with respect to the linearly-varied AGC voltage VAGC, the gain PG [dB] of each of the IF-stage variable amplifying circuits 2 and 3 is similarly controlled linearly with respect to the linearly-varied AGC voltage VAGC.

Since the current-constant mode variable amplifying circuit 4 is constructed of the current mirror circuits, the current-constant mode variable amplifying circuit and the current variable mode variable amplifying circuit can be controlled by the common AGC voltage VAGC. Further, since the IF-stage variable amplifying circuits 2 and 3 are respectively configured in the current-variable mode, power consumption can be reduced. When they are applied to the CDMA mode portable telephone, the life of a battery can be made long. Since the operating-current constant type variable amplifying circuit constituting the RF-stage variable amplifying circuit 4 is of a common-base type in basic configuration and the common base circuit is excellent in frequency response, it has satisfactory gain control characteristics even in the case of a UHF band.

Figure 3:
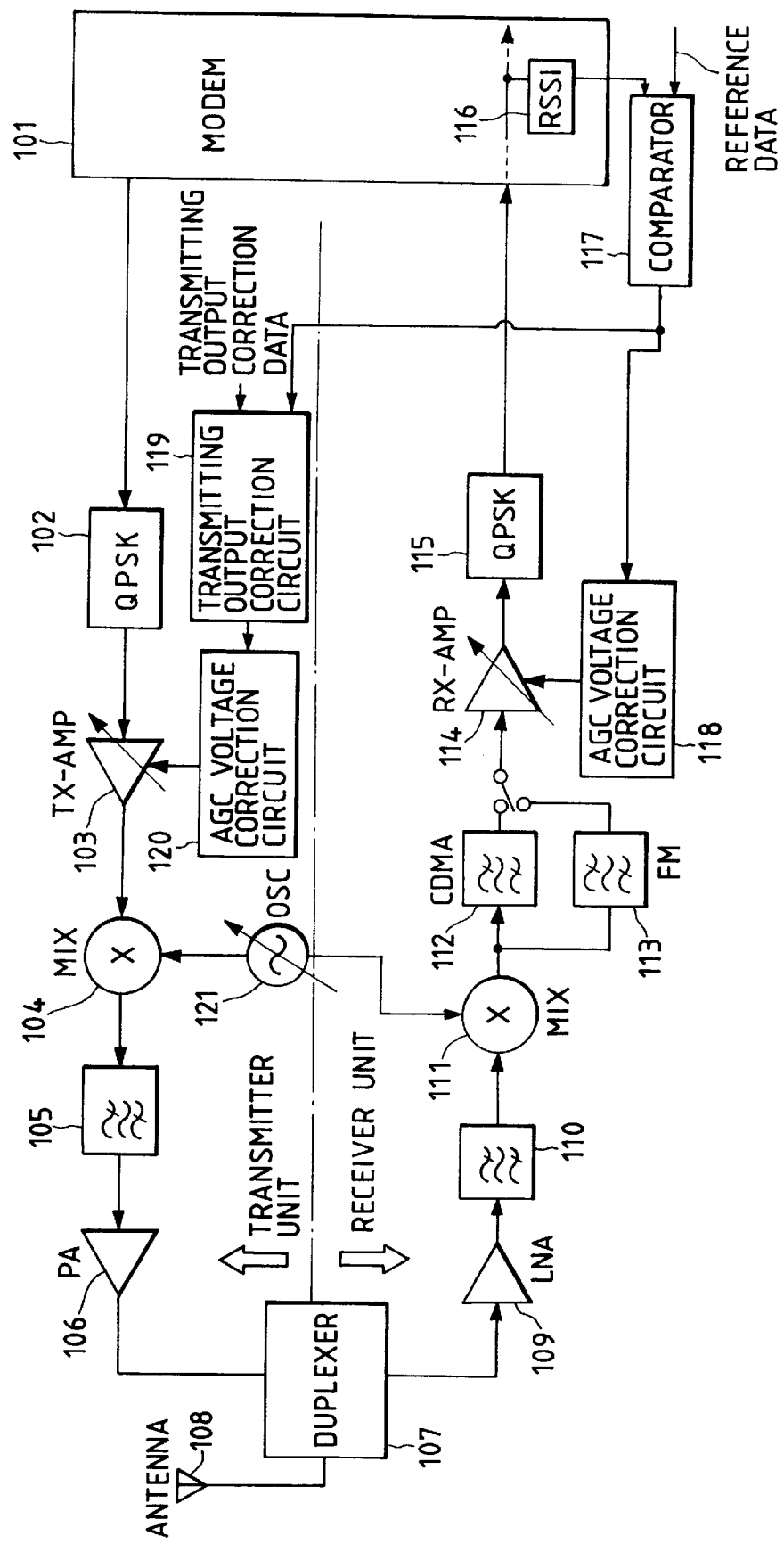
FIG. 3 is a block diagram illustrating a CDMA mode portable telephone to which the amplifier circuit shown in FIG. 1 is applied.

Since the same gain slope as the receiver unit having the variable amplifying circuits only in the IF stages can be realized even if the variable amplifying circuit 4 is provided in the RF stage, the amplifier circuits can be applied even to the CDMA mode portable telephone which needs to control the amplification degree of the transmitter circuit according to the strength (RSSI) of the received signal as shown in FIG. 3. Further, the QPSK modulator 1, IF-stage variable amplifying circuits 2 and 3, mixer 5 and RF-stage variable amplifying circuit 4 can be constructed of one IC.

According to the present invention, as has been described above, an intermediate frequency variable amplifying circuit is configured in a drive-current variable mode, a radio-frequency variable amplifying circuit is configured in a drive-current constant mode, and a linearly-varied AGC voltage is converted to an exponentially-varied current, whereby the amplification degree of each variable amplifying circuit is controlled based on the common current. Therefore, the drive-current variable mode intermediate frequency variable amplifying circuit and the drive-current constant mode radio-frequency variable amplifying circuit are controlled based on the linear to the same AGC voltage. Accordingly, a large dynamic range can be realized in a simple structure.

What is claimed is:

1. An amplifier circuit suitable for use in a transmitter, comprising:

a drive-current variable mode intermediate frequency variable gain amplifying circuit for amplifying an intermediate frequency signal;

a frequency converting circuit for converting the intermediate frequency signal amplified by said intermediate frequency variable gain amplifying circuit into a radio-frequency signal;

a drive-current constant mode radio-frequency variable gain amplifying circuit for amplifying the radio-frequency signal, said radio-frequency variable gain amplifying circuit having at least one pair of transistors whose emitters are electrically connected to a common constant-current source and supplied with a radio-frequency signal through the emitters thereof, said one transistor having a base supplied with an AGC voltage, said other transistor having a base electrically connected to ground, and said one or other transistor having a collector for outputting a signal therefrom; and an amplification-degree control circuit for converting an AGC voltage to a control current and supplying the control current as a drive current for said each variable gain amplifying circuit, thereby controlling the amplification degree of said each variable gain amplifying circuit.

* * * * *